United States Patent [19]

Nishimura et al.

[11] Patent Number: 5,721,159
[45] Date of Patent: Feb. 24, 1998

[54] METHOD FOR MANUFACTURING AND TESTING A NONVOLATILE MEMORY DEVICE

[75] Inventors: Kiyoshi Nishimura; Takaaki Fuchikami, both of Ukyo-ku, Japan

[73] Assignee: Rohm Co., Ltd., Kyoto, Japan

[21] Appl. No.: 711,341

[22] Filed: Sep. 5, 1996

[30] Foreign Application Priority Data

Sep. 14, 1995 [JP] Japan ................................. 7-236953

[51] Int. Cl.$^6$ .......................... H01L 21/66; G01R 31/26
[52] U.S. Cl. ........................................... 438/14; 438/3
[58] Field of Search ............................ 437/8, 52, 43, 437/919; 438/14, 3

[56] References Cited

U.S. PATENT DOCUMENTS

| | | | |
|---|---|---|---|
| 4,961,053 | 10/1990 | Krug | 437/8 |
| 5,254,482 | 10/1993 | Fisch | 437/8 |
| 5,298,433 | 3/1994 | Furuyama | 437/8 |

*Primary Examiner*—Jey Tsai
*Attorney, Agent, or Firm*—Merchant, Gould, Smith, Edell, Welter & Schmidt, P.A.

[57] ABSTRACT

On completion of a test for data storing characteristics under a condition of the wafer (step S4), the test data are rewritten to the data having inverted data pattern (step S6). Thereafter, package-sealing process is carried out (step S8). Then, the conditions of the test for data storing characteristics after packaging the memory are set (step S10). Set of the conditions is carried out by calculating the data pattern of a step for heating under data storing condition, heating duration and heating temperature, all of which will be carried out in the next process in accordance with the stress calculated in every data pattern as to the step S4 and the step S8 which have been completed. The "habit of data storing" of the ferroelectric memory device can be decreased throughout all the steps for heating under data storing condition by setting the conditions of step for heating under data storing condition which will be carried out in next process so as sum total of the stress for each data pattern to make close with one another as much as possible.

17 Claims, 7 Drawing Sheets

METHOD FOR MANUFACTURING AND TESTING A NONVOLATILE MEMORY DEVICE

BACKGROUND OF INVENTION

1. Field of the Invention

This invention relates to an nonvolatile memory device and a method for manufacturing thereof, more specifically improvement of characteristics for data storing of the nonvolatile memory device.

2. Description of the Related Art

An nonvolatile memory is known as a semiconductor device which maintains stored data even after turning off supply of electric power. Test for data storing characteristics is carried out as a routine procedure in manufacturing processes of the nonvolatile memory device. The test for data storing characteristics is a test for checking duration of data storing to each of memory elements composes the nonvolatile memory device, and each of memory elements stores either "0" or "1" as data. The data stored into the memory element are maintained quite long time. On the other hand, the duration of data storing is shorten when the memory element is heated. In order to reduce the test period, the test for data storing characteristics is carried out under high temperature condition.

However, the method for manufacturing the nonvolatile memory in the prior art has following problems to resolve. Following processes are carried out in the manufacturing processes of the prior art as shown in FIG. 6. Data for the test are stored into the nonvolatile memory (step ST2), and the test for data storing characteristics is carried out under high temperature condition when the nonvolatile memory is in a wafer (step ST4). Package-sealing process is carried out while maintaining the data stored in the test (step ST6). Also, the package-sealing process is carried out under high temperature condition.

On completion of the package-sealing process, the test for data storing characteristics is carried out again (step ST8). In the test, data identical with the stored data in the test carried out previously are recorded in each of the memory element. The test for data storing characteristics is carried out under high temperature condition as in the same manner of the test carried out previously. So that, each of the memory elements experiences a total of three heat treatments with storing the identical data.

In the meantime, it is known that there is a memory element which has a "habit of data storing" such as a memory device using ferroelectric material. The "habit of data storing" is phenomena which exhibit degradation of data storing capability of inverted data (for instance "0") when data ("1") is stored into the memory element for long time or under high temperature condition.

Therefore, degradation of data storing capability may occur in the memory element having the "habit of data storing" before shipment of the memory which is made by the manufacturing processes of the nonvolatile memory device described in the above.

OBJECT AND SUMMARY OF THE INVENTION

An object of the present invention is to provide an nonvolatile memory device and a method for manufacturing thereof which resolve the problems of the nonvolatile memory device such as the nonvolatile memory in the prior art, that is to decrease probability of degradation of data storing characteristics before the shipment as to the ferroelectric memory devices which cause the "habit of data storing".

In accordance with characteristics of the present invention, a method for manufacturing an nonvolatile memory device comprises memory elements each of which having data storing characteristics correspond to each value of data to be stored, the data storing characteristics influenced by values of stored data, duration of data storing and temperature applied in a state of data storing, characterized in that, a step for heating under data storing condition carried out in a state of data storing during heat treatment is performed more than two times, and the values of stored data in at least one of the steps for heating under data storing condition are set under different values from the values of storing data of other step for heating under data storing condition.

Also, in accordance with characteristics of the present invention, an nonvolatile memory device comprises memory elements each of which having data storing characteristics correspond to each value of data to be stored, the data storing characteristics influenced by values of stored data, duration of data storing and temperature applied in a state of data storing, characterized in that, the nonvolatile memory device is heated under more than two different processes in a state of data storing, and the values of stored data in at least one of the steps for heating under data storing condition are set under different values from the values of storing data of other step for heating under data storing condition.

Further, in accordance with characteristics of the present invention, an nonvolatile memory device comprises memory elements each of which having data storing characteristics correspond to each value of data to be stored, the data storing characteristics influenced by values of stored data, duration of data storing and temperature applied in a state of data storing, characterized in that, the nonvolatile memory device is composed so as values of the data storing characteristics correspond to each value of data to be stored to make substantially equivalent with one another.

While the novel features of the invention are set forth in a general fashion, both as to organization and content, it will be better understood and appreciated, along with other objections and features thereof, from the following detailed description taken in conjunction with the drawings.

DETAILED DESCRIPTION OF THE PREFERRED EMBODIMENT

Figure 1:
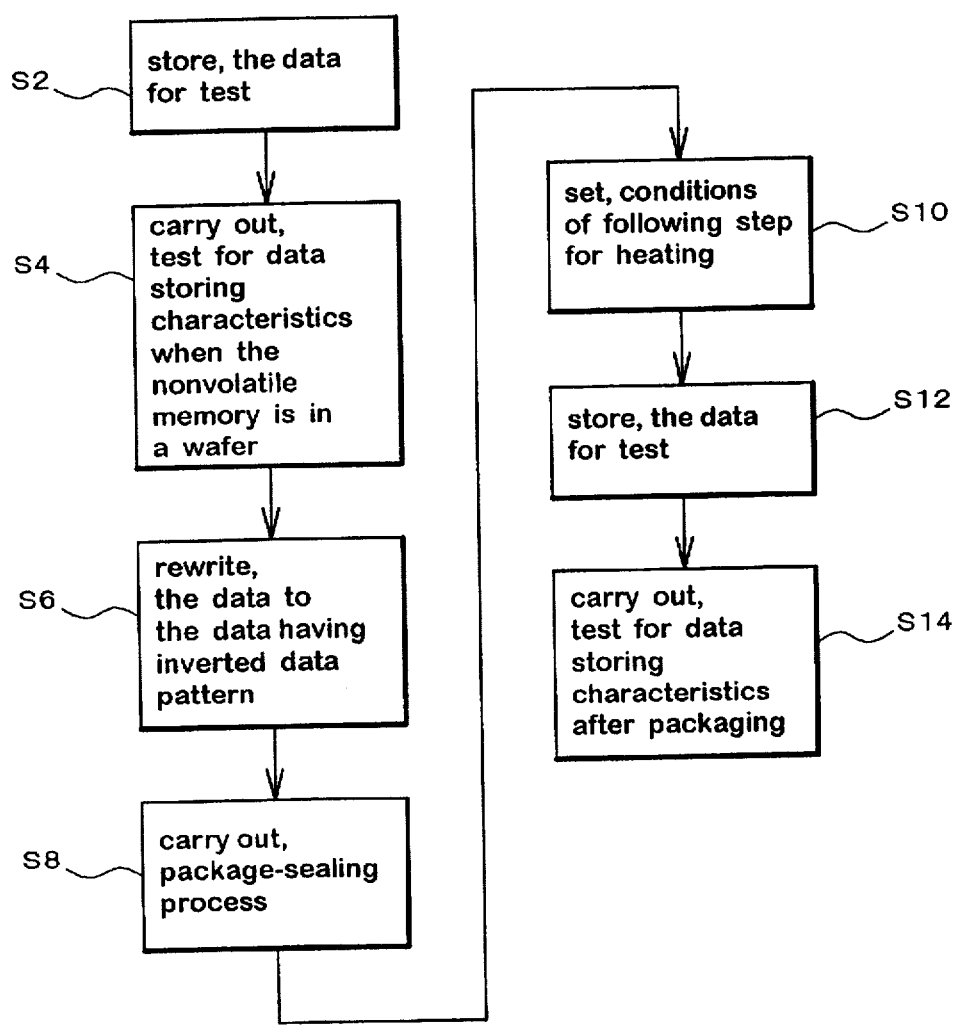
FIG. 1 is a flow-chart showing a part of a manufacturing method of a ferroelectric memory as a method for manufacturing an nonvolatile memory device in an embodiment of the present invention.

FIG. 1 is a flow-chart showing a part of a manufacturing method of a ferroelectric memory (hereinafter referred to as memory) as a method for manufacturing an nonvolatile memory device in an embodiment of the present invention.

As shown in FIG. 1, test data as storing data are stored into a plurality of the memory formed in a wafer (step S2). The test data are given in a data pattern of binary system such as "0100101110 ... ", and each bit of the binary system is stored into each of ferroelectric memory elements which construct the memory. For the reason of convenience for explanation, the given data pattern of the test data is referred to as the first data pattern.

Further, a test for data storing characteristics act as a step for heating under data storing condition is carried out under a condition of storing the test data of the first data pattern (step S4). The test for data storing characteristics is carried out by examining whether the memory stores the test data or not after performing heat-treatment for certain period of time.

Then, the test data of the first data pattern stored into the memory in the step S2 are rewritten to the data having inverted data pattern (step S6). For instance, data of "1" is stored into the ferroelectric memory element which stores "0" in the step S2. So that, data of "1011010001 ... " are stored instead of the above mentioned data pattern "0100101110 ... ". For the reason of convenience for explanation, the given data pattern of the test data is referred to as the second data pattern.

Next, package-sealing process act as a step for heating under data storing condition is carried out (step S8). During the package-sealing process, heat-treatment is carried out to the memory under a condition of storing the data of the second data pattern.

Figure 2:
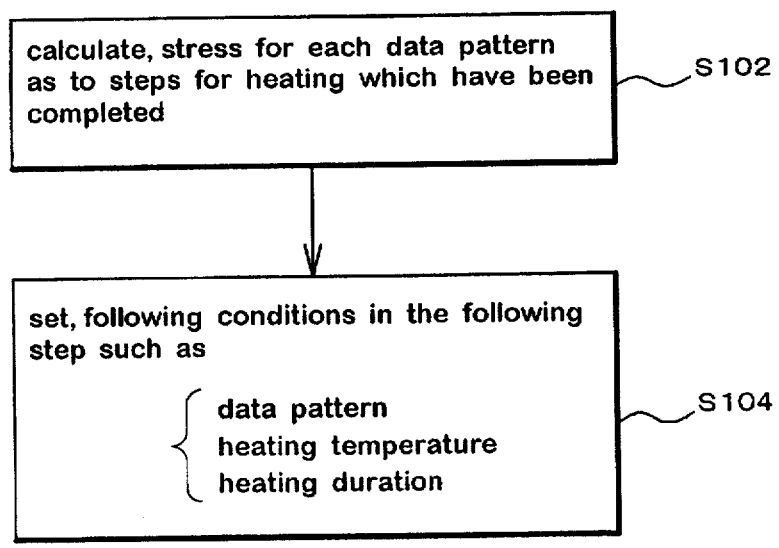
FIG. 2 is a detailed flow-chart showing process of step S10 in FIG. 1.

Further, it is carried out to set the conditions of the test for data storing characteristics after packaging the memory (step S10). In this embodiment, the test for data storing characteristics is carried out as a step for heating under data storing condition which will be carried out later. Detailed process of the step S10 is shown in FIG. 2. In the process, the stress generated during the steps for heating under data storing condition which have already been completed is calculated for each of the data patterns. In other words, the stress generated during the test for data storing characteristics carried out in the step S4 under a condition of the wafer and that of the package-sealing process in the step S8 is calculated for each data pattern (step S102). The formula for calculating the stress for each data pattern is shown as follows.

$$S1 = \Sigma_{i=1,n}(D1_i \times exp\ (Ea/k \times (1/Ta - 1/Tb1_i)))$$

$$S2 = \Sigma_{i=1,m}(D2_i \times exp\ (Ea/k \times (1/Ta - 1/Tb2_i))) \qquad \text{(formula 1)}$$

In the formula 1, each of below explains definition of the symbols.

S1: stress generated in the first data pattern

S2: stress generated in the second data pattern n: the number of steps for heating under data storing condition of the first data pattern which have been completed m: the number of steps for heating under data storing condition of the second data pattern which have been completed $D1_i$: heating duration of i th step for heating under data storing condition of the first data pattern $D2_i$: heating duration of i th step for heating under data storing condition of the second data pattern $Tb1_i$: heating temperature (absolute temperature) of i th step for heating under data storing condition of the first data pattern $Tb2_i$: heating temperature (absolute temperature) of i th step for heating under data storing condition of the second data pattern Ea: active energy of ferroelectric material K: Boltzmann constant ($8.62 \times 10^{31\ 5}$ eV/°K)

Ta: ordinary temperature (absolute temperature)

In this specification, an equation such as $\Sigma_{i=1,h}(C_i) = C_1 + C_2 + \ldots + C_h$ is satisfied.

Then, it is carried out to set the data pattern, heating temperature and heating duration as the conditions of the test for data storing characteristics after packaging the memory (step S104). In this embodiment, the test for data storing characteristics is carried out as a step for heating under data storing condition which will be carried out later.

The difference dS among the stress for each data pattern thus calculated is computed by following equation such as $dS = (S1 - S2)$. Data pattern of the test for data storing characteristics after packaging the memory is determined in accordance with value of the difference dS whether the value is in positive or negative. For instance, the data pattern of the test for data storing characteristics after packaging the memory is set to the second pattern when the result of calculation of the difference dS is in positive.

Further, heating temperature and heating duration of the test for data storing characteristics after packaging are set in accordance with the absolute value of the difference dS. The heating temperature $Tb2_{m+1}$ and the heating duration $D2_{m+1}$ are set so as the stress $S2_{m+1}$ generated in the memory by carrying out the test for data storing characteristics after packaging the memory to make close as much as possible to the difference dS calculated in the above, when the data pattern of the test for data storing characteristics after packaging the memory is set to the second data pattern.

The stress $S2_{m+1}$ generated in the memory by carrying out the test for data storing characteristics after packaging the memory is calculated by the following equation such as $$S2_{m+1} = D2_{m+1} \times exp\ (Ea/k \times (1/Ta - 1/Tb2_{m+1}))$$

Thus, the test data set in the step S104 are stored into the memory as shown in FIG. 1, after setting conditions of the test for data storing characteristics after packaging the memory as a step for heating under data storing condition which will be carried out later (step S12).

The test for data storing characteristics after packaging the memory is carried out under conditions of the heating temperature $Tb2_{m+1}$ and the heating duration $D2_{m+1}$ both of which being set in the step S104 (step S14). Thus, the "habit of data storing" in the step for heating under data storing condition can be decreased by setting the conditions of the step for heating under data storing condition so as sum total of the stress for each data pattern to make close with one another as much as possible.

Figure 7:
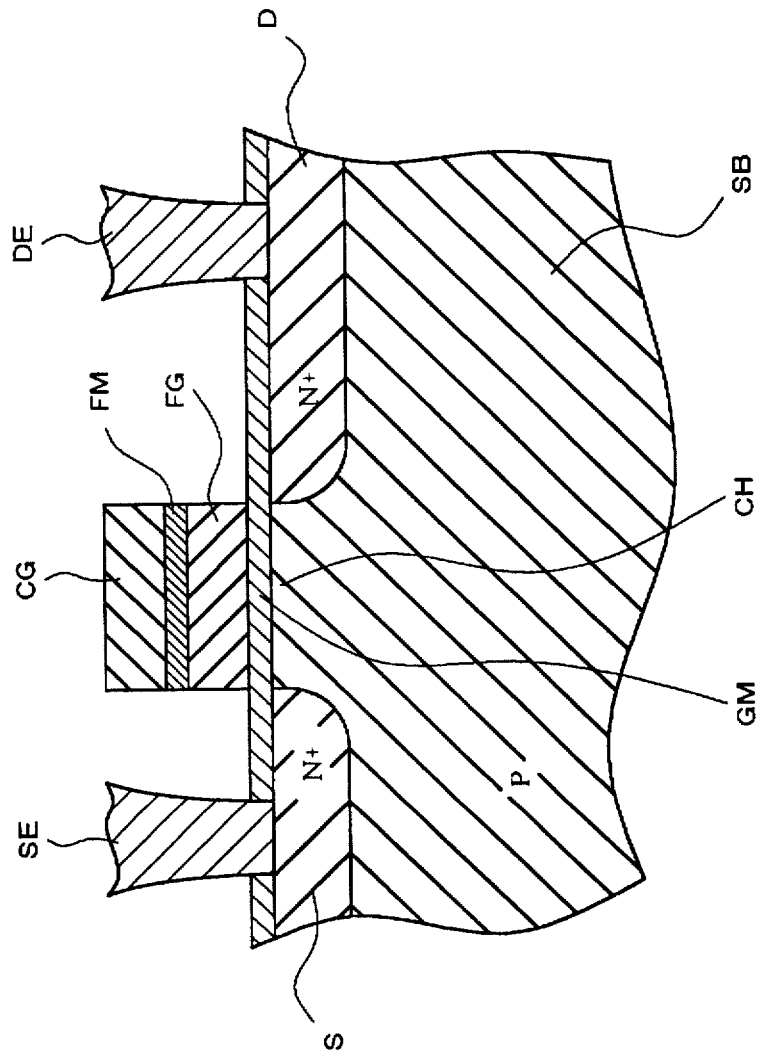
FIG. 7 is a sectional view showing a part of the ferroelectric memory constructed as the nonvolatile memory device in an embodiment of the present invention.

FIG. 7 shows a sectional view illustrating a part of the memory constructed as an nonvolatile memory device manufactured in the method described in the above. The memory is composed so as to accumulate a gate oxidation layer GM made of insulator, a floating gate FG made of conductor, a ferroelectric layer FM made of ferroelectric substance and a control gate CG made of conductor one after another in order on a channel region CH formed between a source S and a drain D both of which being provided in a substrate SB. Both of a wiring SE and another wiring DE are connected to the source S and the drain D respectively.

As described in the above, the memory is designed so as the sum total of the stress for each data pattern to make close with one another as much as possible. So that, data storing characteristics correspond to each of the data to be stored are almost the same with one another.

Although, the data of the first data pattern stored into the memory in the step S2 is rewritten to the data having inverted data pattern in the step S6 of the above embodiment, the processes after the step S8 can be carried out by utilizing data of the first data pattern stored into the memory in the step S2 as it is without rewriting the data of the first data pattern as in the step S6.

Also, in the step S10, calculation of the conditions of the third steps for heating under data storing condition is carried out in accordance with the sum total of stress generated by the steps for heating under data storing condition in both the step S4 and the step S8. Whereas it is possible to calculate conditions of the next steps for heating under data storing condition every time each of the steps for heating under data storing condition is completed.

Figure 3:
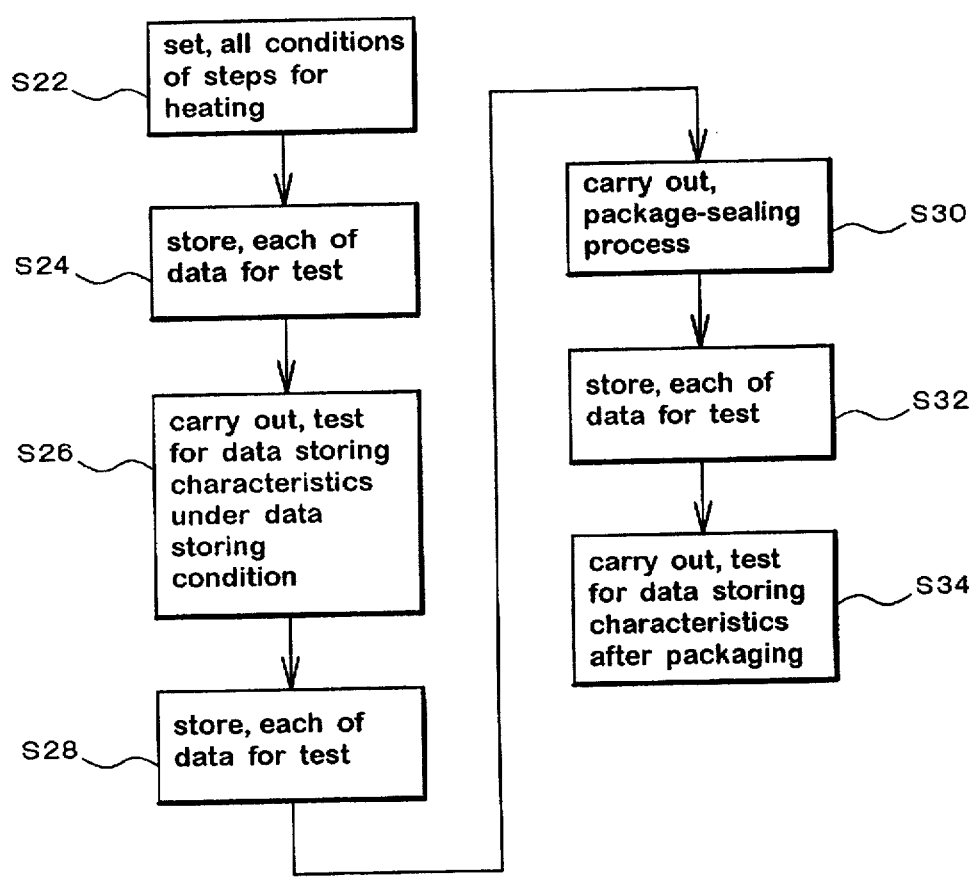
FIG. 3 is a flow-chart showing a part of the manufacturing method of the ferroelectric memory as another embodiment of the present invention.

Next, FIG. 3 is a flow-chart showing a part of the manufacturing method of the ferroelectric memory as another embodiment of the present invention.

The manufacturing method of the memory shown in FIG. 3 is different from that of shown in FIG. 1 in view of following points. Although the manufacturing method shown in FIG. 3 carries out each of the steps for heating under data storing condition in accordance with the conditions being set at initial stage, the manufacturing method shown in FIG. 1 carries out one or more than one steps for heating under data storing condition without setting any conditions, then conditions of the following step for heating under data storing condition is set in accordance with the stress generated during the steps for heating under data storing condition which have already been completed.

At first, all the conditions of the steps for heating under data storing condition are set in the manufacturing method as shown in FIG. 3 (step S22). In the setting of conditions of the steps for heating under data storing condition, data pattern of the test data in every step for heating under data storing condition, $D1_i$, $Tb1_i$, $D2_i$, and $Tb2_i$ are set so as the stress S1 and the stress S2 calculated by the formula 1 to make close with each other as much as possible.

Whereas, both n and m explain definition of the symbols in the formula 1.

n: a total number of steps for heating under data storing condition carried out with the first data pattern.

m: a total number of steps for heating under data storing condition carried out with the second data pattern.

Thereafter, storing of each of test data (step S24, S28, and S32) and every step for heating under data storing condition (step S26, S30 and S34) are carried out in accordance with the conditions set in the step S22.

Figure 4:
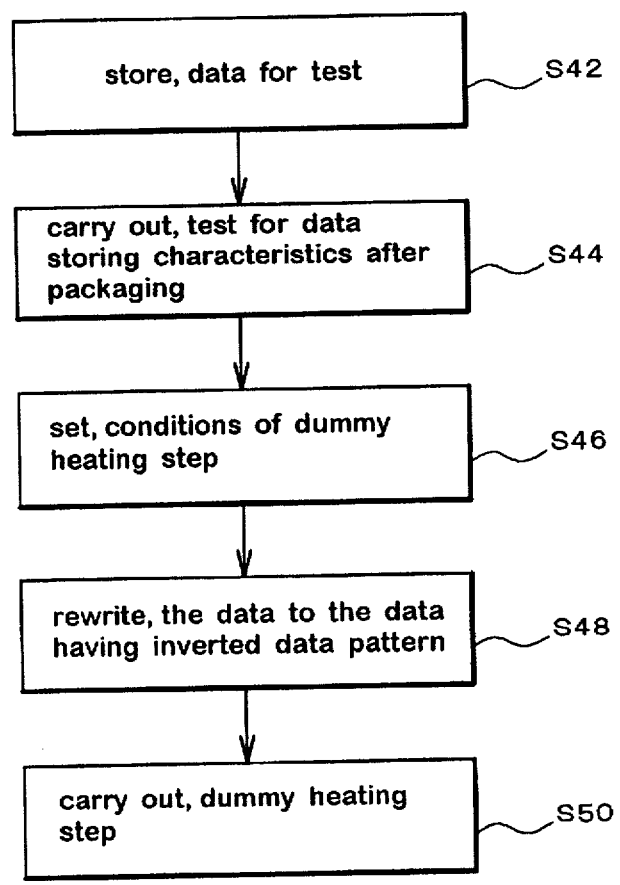
FIG. 4 is a flow-chart showing a part of the manufacturing method of the ferroelectric memory as far another embodiment of the present invention.

Next, FIG. 4 is a flow-chart showing a part of the manufacturing method of the memory as far another embodiment of the present invention.

The manufacturing method of the memory shown in FIG. 4 is different from that of shown in FIG. 1 in view of only have the test for data storing characteristics after packaging the memory as the step for heating under data storing condition which is required to manufacture the memory. Also, another difference between the manufacturing method shown in FIG. 4 and that of FIG. 1 is that having dummy heating process only for heating in the manufacturing method shown in FIG. 4. In the manufacturing method, at first, test data are stored into the memory as shown in FIG. 4 (step S42). Then, the test for data storing characteristics after packaging the memory is carried out (step S44).

On completion of the test, following steps are carried out, such as a step for setting the conditions of the dummy heating process under data storing condition (step S46), a step for rewriting the data pattern stored into the memory to the data having inverted data pattern (step S48) and a step for carrying out the dummy heating process in accordance with the conditions set in the step S46 (step S50). The steps from the step S46 to the step S50 in this manufacturing method are almost the same procedures as the steps from the step S10 to the step S14 in the manufacturing method of the memory shown in FIG. 1.

In the manufacturing method, the step S44 is only the step for heating under data storing condition which is required to manufacture the memory as shown in FIG. 4. So that, the stress is provided only to a specific data pattern if the dummy heating process is not carried out, because the number of the data pattern stored in the step for heating under data storing condition becomes one data pattern. The "habit of data storing" in the step for heating under data storing condition is prevented by dispersing the stress to each of the data patterns.

Although the step for heating under data storing condition necessary to manufacture the memory is carried out once in this embodiment, the dummy heating process can be carried out even when the step for heating under data storing condition necessary to manufacture the memory is carried out more than twice. For instance, a dummy heating process can be added to either of before or after the step S14 when the stress generated during the steps for heating under data storing condition which have already been completed can not be dispersed by the step for heating under data storing condition carried out in the step S14 for some reasons.

Figure 5:
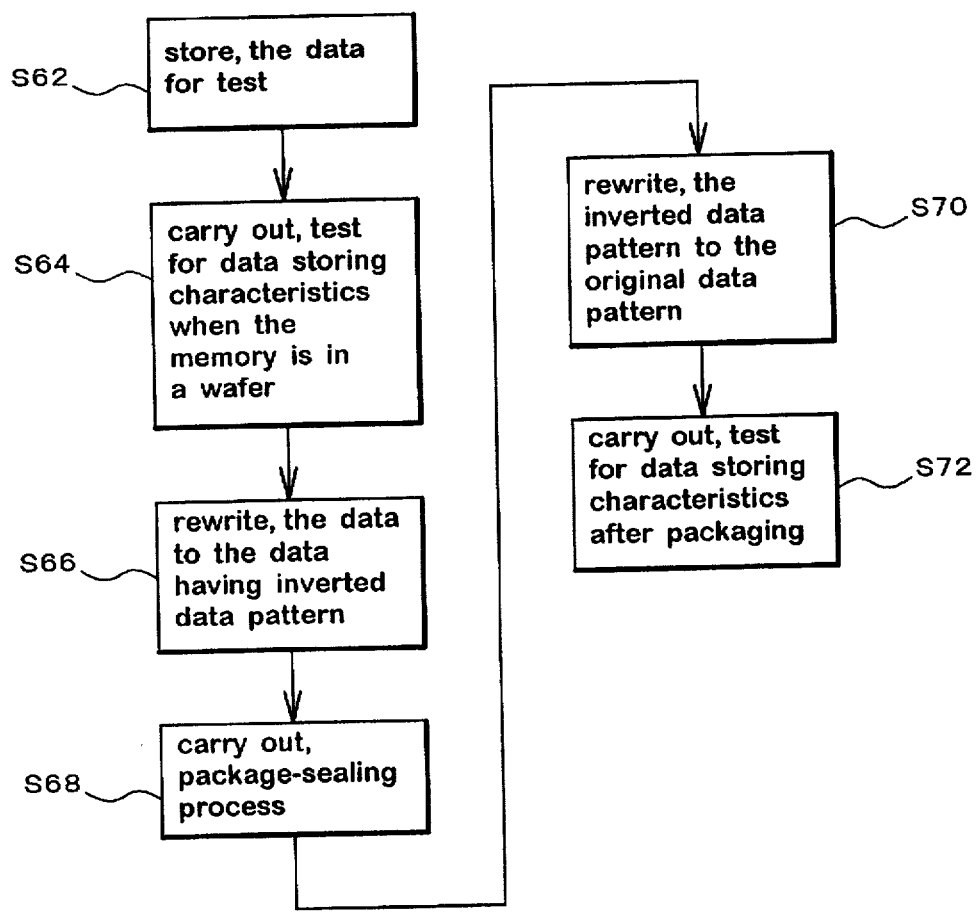
FIG. 5 is a flow-chart showing a part of the manufacturing method of the ferroelectric memory as still another embodiment of the present invention.
Figure 6:
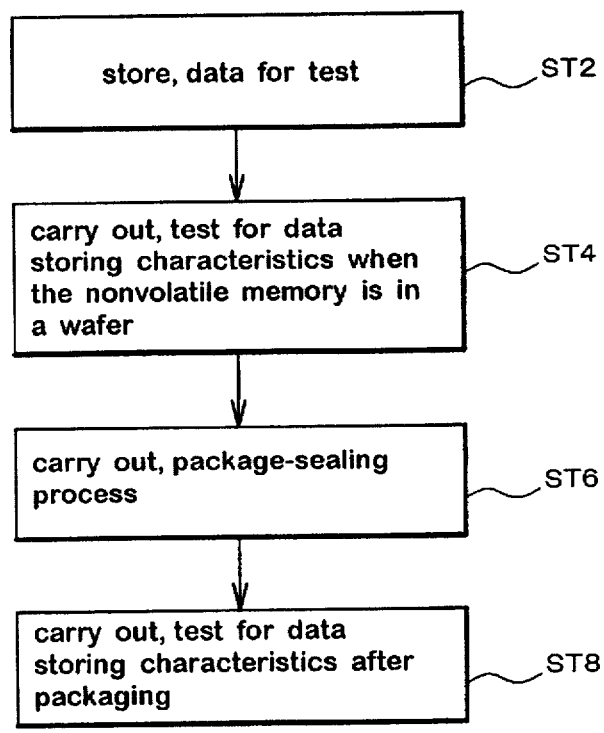
FIG. 6 is a flow-chart showing a part of the manufacturing method of the ferroelectric memory in the prior art.

Next, FIG. 5 is a flow-chart showing a part of the manufacturing method of the memory as still another embodiment of the present invention. The manufacturing method of the memory shown in FIG. 5 is different from that of the memory shown in FIG. 1 in view of not carrying out a step for setting conditions of the following step for heating under data storing condition.

As shown in FIG. 5, following processes are carried out as in the manufacturing method shown in FIG. 1. Test data are stored into the memory (step S62). Also, the test for data storing characteristics is carried out under a condition of the wafer (step S64). Further, the data pattern stored into the memory is rewritten to the data having inverted data pattern (step S66). Then a package-sealing process is carried out (step S68).

Further, the data pattern of the memory is inverted to the data pattern set in the step S62 without setting the conditions of the following steps for heating under data storing condition (step S70). Then, the test for data storing characteristics after packaging the memory is carried out (step S72).

By composing the method for manufacturing the non-volatile memory device as stated in the above, the stress for each data pattern can be dispersed in some degree without carrying out setting of the conditions of the following step for heating under data storing condition which requires complex calculation.

Although at least one of the steps for heating under data storing condition is the test for data storing characteristics in the embodiments described in the above, the present invention can also be applied to an embodiment which does not include the test for data storing characteristics in the step for heating under data storing condition.

Also, the nonvolatile memory is used as the memory in the embodiments described in the above. The present invention can be applied to other types of the memory except for the nonvolatile memory.

The present invention is characterized in that, the values of stored data in at least one of the steps for heating under data storing condition are set under different values from the values of storing data of other step for heating under data storing condition. So that, less probability to occur the "habit of data storing" of the ferroelectric memory devices is observed in comparison with when the same values of the stored data are provided in all the steps for heating under data storing condition. Therefore, the data storing characteristics correspond to each value of the data to be stored become similar values with one another. In other words, it is possible to prevent degradation of the data storing characteristics of the ferroelectric memory devices before shipment of the memory devices.

Also, the present invention is characterized in that, the method for manufacturing the nonvolatile memory device is composed so as values of the data storing characteristics correspond to each value of data to be stored to make close with one another as much as possible by adjusting both of the duration of data storing and the temperature applied in a state of data storing or either of which, in the step for heating under data storing condition. So that, the conditions of the steps for heating under data storing condition can be set so as to lower the probability to occur the "habit of data storing" of the ferroelectric memory devices. As a result of that, the data storing characteristics correspond to each value of the data to be stored become more similar values with one another. In other words, it is possible to prevent further degradation of the data storing characteristics of the ferroelectric memory devices before shipment of the memory devices.

Further, the present invention is characterized in that, at least one of the steps for heating under data storing condition is carried out as a test for data storing characteristics. So that, the "habit of data storing" of the ferroelectric memory devices is not accelerated in the test for data storing characteristics carried out at high temperature. In other words, it is possible to prevent degradation of the data storing characteristics of the ferroelectric memory devices before shipment even in the ferroelectric memory devices which require to carrying out the test for data storing characteristics.

Still further, the present invention is characterized in that, the nonvolatile memory device has the memory elements using ferroelectric substance. So that, the "habit of data storing" of the ferroelectric memory devices can be reduced even when the ferroelectric memory devices use ferroelectric substance which has a tendency to cause the "habit of data storing". In other words, it is possible to prevent degradation of the data storing characteristics of the ferroelectric memory devices before shipment even in the ferroelectric memory devices using ferroelectric substance which has a tendency to cause the "habit of data storing".

The present invention is characterized in that, the nonvolatile memory device is composed so as values of the data storing characteristics correspond to each value of data to be stored to make substantially equivalent with one another. So that, the data storing characteristics become almost the uniform regardless of the values of the data to be stored. In other words, an nonvolatile memory device which has high reliability as to the data storing characteristics can be realized.

While the invention has been described in its preferred embodiments, it is to be understood that the words which have been used are words of description rather than limitation and that changes within the purview of the appended claims may be made without departing from the true scope and spirit of the invention in its broader aspects. Therefore, it is possible to realize a semiconductor device which prevent damages caused by the anisotropic etching with saving manufacturing cost.

What is claimed is:

1. A method for manufacturing an nonvolatile memory device comprising memory elements each of which having data storing characteristics correspond to each value of data to be stored, the data storing characteristics influenced by values of stored data, duration of data storing and temperature applied in a state of data storing, characterized in that, a step for heating under data storing condition carried out under a state of data storing during heat treatment is performed more than two times, and the values of stored data in at least one of the steps for heating under data storing condition are set under different values from the values of storing data of other step for heating under data storing condition.

2. A method for manufacturing an nonvolatile memory device in accordance with claim 1, wherein the method for manufacturing the nonvolatile memory device is composed so as values of the data storing characteristics correspond to each value of data to be stored to make close with one another as much as possible by adjusting both of the duration of data storing and the temperature applied in a state of data storing or either of which, in at least one of the steps for heating under data storing condition.

3. A method for manufacturing an nonvolatile memory device in accordance with claim 1, wherein at least one of the steps for heating under data storing condition is carried out as a test for data storing characteristics.

4. A method for manufacturing an nonvolatile memory device in accordance with claim 1, wherein the nonvolatile memory device has the memory elements using ferroelectric substance.

5. A method for manufacturing an nonvolatile memory device in accordance with claim 1, wherein the conditions of steps for heating under data storing condition which will be carried out later are set in consideration of influences provided to the data storing characteristics of the steps for heating under data storing condition which have been completed.

6. A method for manufacturing an nonvolatile memory device in accordance with claim 5, wherein stress for the each storing data generated in the steps for heating under data storing condition which have been completed is calculated, and wherein the conditions of steps for heating under data storing condition which will be carried out later are set in accordance with the calculated stress.

7. A method for manufacturing an nonvolatile memory device in accordance with claim 6, wherein the nonvolatile memory device has the memory elements using ferroelectric substance, and wherein the storing data are provided in a pattern of binary system, and wherein stress S1 for the storing data in a first data pattern as a predetermined arranging pattern of the storing data, and stress S2 for the storing data in a second data pattern as an inverted data pattern of the first data pattern both of which generated in the steps for heating under data storing condition which have been completed are calculated by following equation, $$S1=\Sigma_{i=1,n}(D1_i \times exp\ (Ea/k \times (1/Ta-1/Tb1_i)))$$

$$S2=\Sigma_{i=1,m}(D2_i \times exp\ (Ea/k \times (1/Ta-1/Tb2_i)))$$

in the formula, each of below explains definition of the symbols, n: the number of steps for heating under data storing condition of the first data pattern which have been completed, m: the number of steps for heating under data storing condition of the second data pattern which have been completed, $D1_i$: heating duration of i th step for heating under data storing condition of the first data pattern, $D2_i$: heating duration of i th step for heating under data storing condition of the second data pattern, $Tb1_i$: heating temperature (absolute temperature) of i th step for heating under data storing condition of the first data pattern, $Tb2_i$: heating temperature (absolute temperature) of i th step for heating under data storing condition of the second data pattern, Ea: active energy of ferroelectric material, K: Boltzmann constant ($8.62 \times 10^{31\ 5}$ eV/°K), Ta: ordinary temperature (absolute temperature), and wherein the arranging pattern of the storing data in steps for heating under data storing condition which will be carried out later is determined in consideration of value of difference dS either of positive or negative, the difference dS is calculated by the following equation, $$dS=(S1-S2).$$

8. A method for manufacturing an nonvolatile memory device in accordance with claim 7, wherein both heating temperature TbX and heating duration DX are set so as to minimize the difference between stress SX and absolute value of the difference dS, and wherein both of the heating temperature TbX and the heating duration DX are used in the step for heating under data storing condition which will be carried out later, and wherein the stress SX provided in the step for heating under data storing condition which will be carried out later using the arranging pattern thus set is calculated by the following equation, $$SX=DX \times exp\ (Ea/k \times (1/Ta-1/Tb1X)).$$

9. A method for manufacturing an nonvolatile memory device in accordance with claim 8, wherein at least one of the steps for heating under data storing condition are carried out as a test for data storing characteristics.

10. A method for manufacturing an nonvolatile memory device in accordance with claim 1, wherein conditions for each of the steps for heating under data storing condition are set in advance, and wherein each of the steps for heating under data storing condition is carried out in accordance with the conditions.

11. A method for manufacturing an nonvolatile memory device in accordance with claim 10, wherein conditions for each of the steps for heating under data storing condition are set so as stress for each value of the storing data in all the steps for heating under data storing condition to make close with one another as much as possible.

12. A method for manufacturing an nonvolatile memory device in accordance with claim 11, wherein the nonvolatile memory device has the memory elements using ferroelectric substance, and wherein the storing data is provided in a pattern of binary system, and wherein stress S1 for the storing data in a first data pattern as a predetermined arranging pattern of the storing data, and stress S2 for the storing data in a second data pattern as an inverted data pattern of the first data pattern both of which generated in the steps for heating under data storing condition which will be carried out later are calculated by following equation, $$S1=\Sigma_{i=1,n}(D1_i \times exp\ (Ea/k \times (1/Ta-1/Tb1_i)))$$

$$S2=\Sigma_{i=1,m}(D2_i \times exp\ (Ea/k \times (1/Ta-1/Tb2_i)))$$

in the formula, each of below explains definition of the symbols, n: the number of steps for heating under data storing condition carried out with the first data pattern, m: the number of steps for heating under data storing condition carried out with the second data pattern, $D1_i$: heating duration of i th step for heating under data storing condition of the first data pattern, $D2_i$: heating duration of i th step for heating under data storing condition of the second data pattern, $Tb1_i$: heating temperature (absolute temperature) of i th step for heating under data storing condition of the first data pattern, $Tb2_i$: heating temperature (absolute temperature) of i th step for heating under data storing condition of the second data pattern, Ea: active energy of ferroelectric material, K: Boltzmann constant ($8.62 \times 10^{31\ 5}$ eV/°K), Ta: ordinary temperature (absolute temperature), and wherein the arranging pattern of the storing data in each step for heating under data storing condition, duration of heating in each step for heating under data storing condition and temperature applied in each step for heating under data storing condition are set so as to minimize the difference dS of the stress between the stress S1 and the stress S2, the difference dS is calculated by the following equation, $$dS=(S1-S2).$$

13. A method for manufacturing an nonvolatile memory device in accordance with claim 12, wherein at least one of the steps for heating under data storing condition are carried out as a test for data storing characteristics.

14. A method for manufacturing an nonvolatile memory device in accordance with claim 1, wherein a dummy heating process only for the purpose of heating is carried out as the step for heating under data storing condition.

15. A method for manufacturing an nonvolatile memory device in accordance with claim 14, wherein at least one of the steps for heating under data storing condition are carried out as a test for data storing characteristics.

16. A method for manufacturing an nonvolatile memory device in accordance with claim 1, wherein the storing data is provided in a pattern of binary system, and wherein arranging pattern of the storing data in one of the steps for heating under data storing condition is arranged as an inverted data pattern of the arranging pattern of the storing data in other steps for heating under data storing condition.

17. A method for manufacturing an nonvolatile memory device in accordance with claim 16, wherein at least one of the steps for heating under data storing condition are carried out as a test for data storing characteristics.

* * * * *